(12) United States Patent
Chen (10) Patent No.: US 9,757,865 B1
(45) Date of Patent: Sep. 12, 2017

(54) CARRIER PLATE ASSEMBLY FOR A WAFER

(71) Applicant: Well Thin Technology, Ltd., Zhubei, Hsinchu County (TW)

(72) Inventor: Teng-Kuei Chen, Zhubei (TW)

(73) Assignee: Well Thin Technology, Ltd., Zhubei (TW)

( * ) Notice: Subject to any disclaimer, the term of this patent is extended or adjusted under 35 U.S.C. 154(b) by 0 days.

(21) Appl. No.: 15/448,647

(22) Filed: Mar. 3, 2017

(51) Int. Cl.
| | | |
|---|---|---|
| *B25J 15/06* | (2006.01) | |
| *B25J 19/00* | (2006.01) | |
| *B25J 11/00* | (2006.01) | |
| *B25J 15/00* | (2006.01) | |
| *H01L 21/687* | (2006.01) | |

(52) U.S. Cl.
CPC ....... *B25J 19/0091* (2013.01); *B25J 11/0095* (2013.01); *B25J 15/0014* (2013.01); *H01L 21/68735* (2013.01); *H01L 21/68785* (2013.01)

(58) Field of Classification Search
CPC ................ B25J 19/0091; B25J 11/0095; B25J 15/0014; H01L 21/6873
USPC .............. 294/64.3, 183, 186, 188, 213, 907; 271/97; 414/941, 744.1, 744.3, 744.5, 414/222.01; 901/30, 31, 40
See application file for complete search history.

(56) References Cited

U.S. PATENT DOCUMENTS

| | | | |
|---|---|---|---|
| 3,158,381 A * | 11/1964 | Yamamura | B25B 11/005 248/362 |
| 5,380,137 A * | 1/1995 | Wada | H01L 21/67309 414/172 |
| 5,783,834 A * | 7/1998 | Shatas | B25J 9/1656 414/941 |
| 6,942,265 B1 * | 9/2005 | Boyd | H01L 21/67742 294/189 |
| 7,055,875 B2 * | 6/2006 | Bonora | H01L 21/6838 294/188 |
| 7,241,099 B2 * | 7/2007 | Tzeng | H01L 21/67742 118/503 |
| 7,384,083 B2 * | 6/2008 | Kent | H01L 21/67126 294/213 |
| 7,669,903 B2 * | 3/2010 | Bonora | H01L 21/6838 294/188 |
| 8,043,042 B2 | 10/2011 | Yazawa et al. | |
| 8,864,202 B1 * | 10/2014 | Schrameyer | B25J 15/0014 294/213 |
| 8,905,680 B2 * | 12/2014 | Lee | H01L 21/6838 269/21 |
| 2005/0110292 A1 * | 5/2005 | Baumann | B25J 9/0012 294/188 |

(Continued)

*Primary Examiner* — Paul T Chin
(74) *Attorney, Agent, or Firm* — Alan D. Kamrath; Kamrath IP Lawfirm, P.A.

(57) ABSTRACT

A carrier plate assembly has a carrier plate and multiple gaskets. The carrier plate has a first end, a second end, and a carrier surface between the first end and the second end. The carrier surface forms multiple accommodating recesses. The gaskets are accommodated in the accommodating recesses. The gaskets prevent the wafer from sliding. Besides, with top surfaces of the gaskets aligning with the carrier surface and an edge of each gasket connected to an edge of an opening of the accommodating recess, the accommodating recess is filled by the gasket, and thus the gasket is securely accommodated in the accommodating recess and may not deform upward.

18 Claims, 6 Drawing Sheets

(56) References Cited

U.S. PATENT DOCUMENTS

2016/0001449 A1\* 1/2016 Pergande ............. B25J 15/0014
361/234

\* cited by examiner

CARRIER PLATE ASSEMBLY FOR A WAFER

CROSS-REFERENCE TO RELATED APPLICATIONS

This application is based upon and claims priority under 35 U.S.C. 119 from Taiwan Patent Application No. 105203395 filed on Mar. 11, 2016, which is hereby specifically incorporated herein by this reference thereto.

BACKGROUND OF THE INVENTION

1. Field of the Invention

The present invention relates to a carrier plate assembly, especially to a carrier plate assembly for a wafer.

2. Description of the Prior Arts

Wafers are silicon sheets used for manufacturing semiconductor integrated circuits. In other words, the integrated circuits can be made by wafers. As manufacture of an integrated circuit requires a lot of processes and the integrated circuit becomes smaller and smaller in size with the trend toward compact-and-slim electronic products, the way to transfer wafers by manpower is replaced by mechanical arms, and thus the efficiency is enhanced and errors caused by human beings are lessened.

As Taiwan patent No. 1441719 discloses, a conventional mechanical arm comprises a clamp, a multiple-joint-arm, and a main body. Two ends of the multiple-joint-arm are connected to the clamp and the main body respectively. The clamp comprises a holding structure for the carrier wafer and comprises an abutting structure mounted on the holding structure but away from the multiple-joint-arm. The multiple-joint-arm can extend and retract and move up and down for carrying or discharging a wafer. However, though the wafer can abut the abutting structure of the conventional mechanical arm, the wafer still may be displaced because of vibration or other factors during transfer of the wafer.

To overcome the shortcomings, the present invention provides a carrier plate assembly and a mechanical arm comprising the carrier plate assembly to mitigate or obviate the aforementioned problems.

SUMMARY OF THE INVENTION

The main objective of the present invention is to provide a carrier plate assembly for a mechanical arm that can prevent the wafer from displacement.

The carrier plate assembly has:
a carrier plate comprising:
a first end;
a second end; and
a carrier surface between the first end and the second end, and the carrier surface forming:
a plurality of the accommodating recesses; and
a plurality of gaskets accommodated in the accommodating recesses respectively, each one of the gaskets comprising:
an inclined annular surface fitting a side surface of the corresponding accommodating recess; and
a top surface aligning with the carrier surface, the top surface forming:
a plurality of protrusions protruding out of the carrier surface; and
a plurality of grooves located between the protrusions.

With the protrusions of the gaskets that protrude out of the carrier surface of the carrier plate, when the wafer is transferred by the mechanical arm and the carrier plate assembly of the present invention, the gaskets provide the wafer with friction to prevent the wafer from sliding under vibrations. Besides, with the vent and the first holes formed on the carrier surface and the second holes formed on the gaskets and communicating with the first holes, the pressure beneath a bottom surface of the wafer and the pressure on a top surface of the wafer can be balanced. In other words, a vacuum area with lower pressure, which causes the wafer to be discharged from the carrier plate, may not be generated under the bottom surface of the wafer. In addition, because top surfaces of the gaskets are aligned and connected to the carrier surface, the accommodating recesses are filled with the gaskets. Moreover, corresponding to the accommodating recesses, upper ends of the gaskets are narrower and lower ends of the gaskets are broader, so the gaskets are accommodated in the accommodating recesses and may not deform upward easily. Therefore, heights of the gaskets are on the same horizontal plane, so that forces exerted on the wafer are the same.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
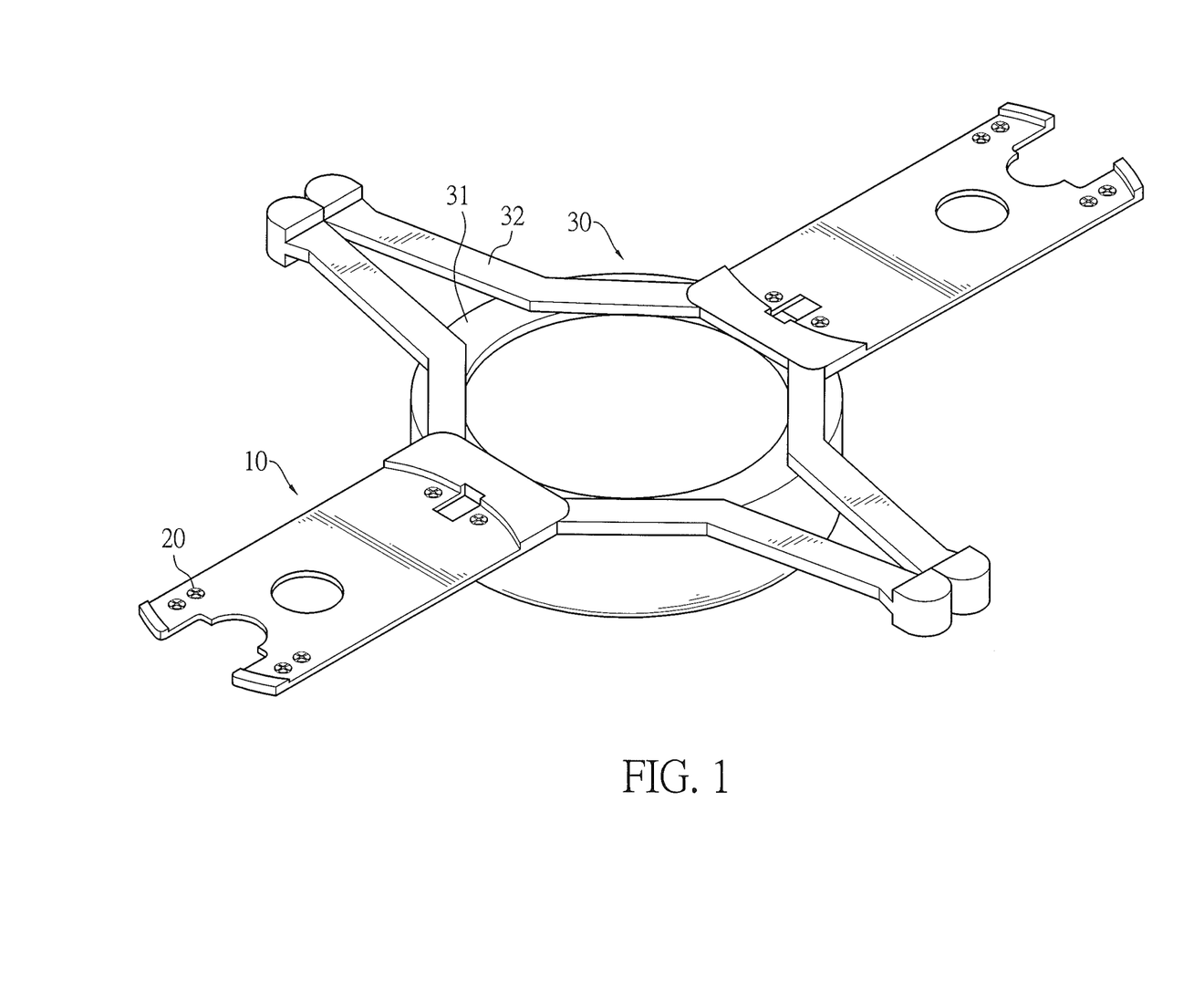
FIG. 1 is a perspective view of a mechanical arm in accordance with the present invention.

With reference to FIG. 1, a carrier plate assembly in accordance with the present invention for preventing a wafer from sliding can be a component of a mechanical arm. Precisely, the mechanical atm may comprise at least one carrier plate assembly and an operating assembly 30. The carrier plate assembly comprises a carrier plate 10 and a plurality of gaskets 20.

Figure 2:
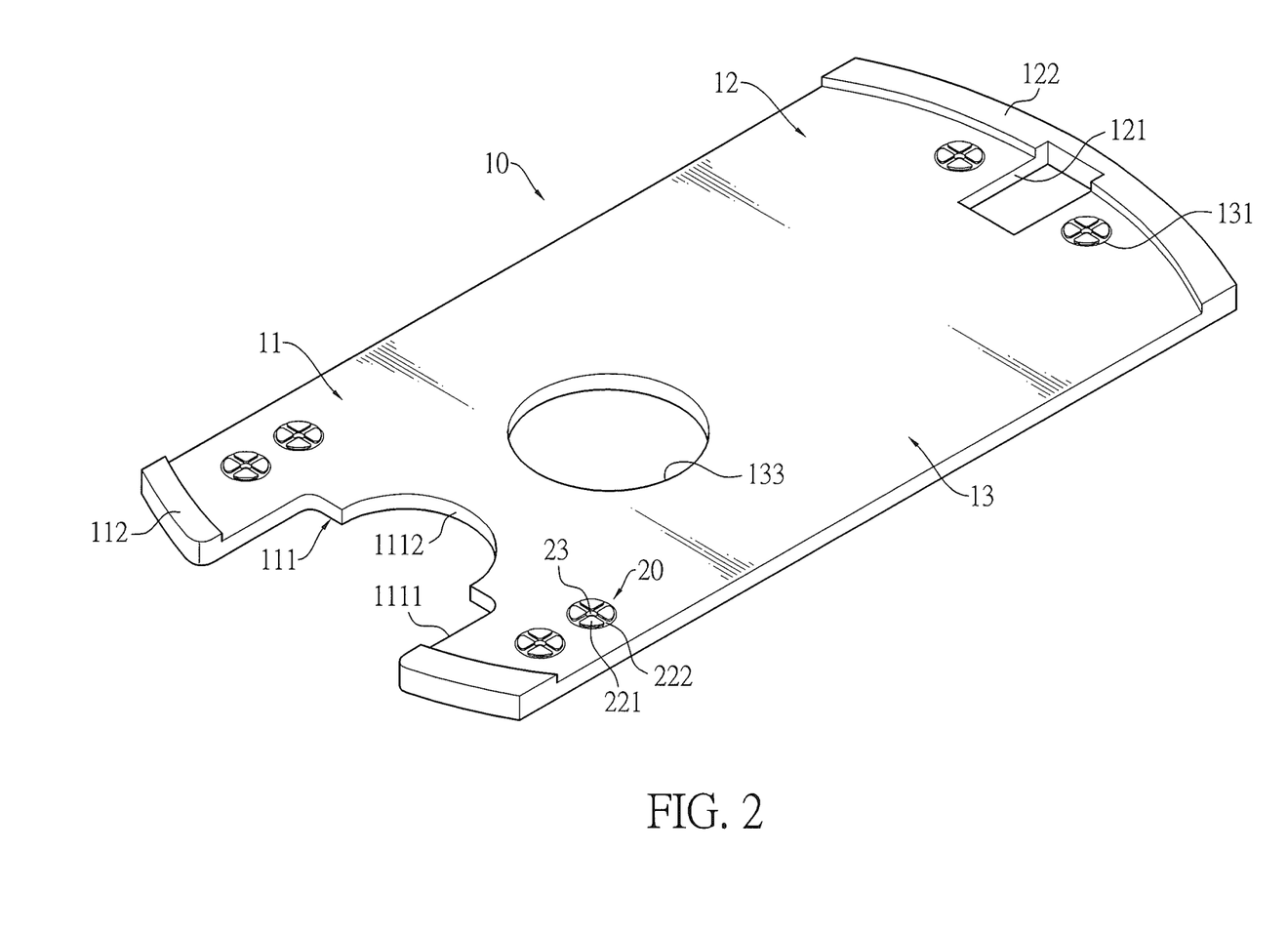
FIG. 2 is a perspective view of a carrier plate assembly in FIG. 1.
Figure 3:
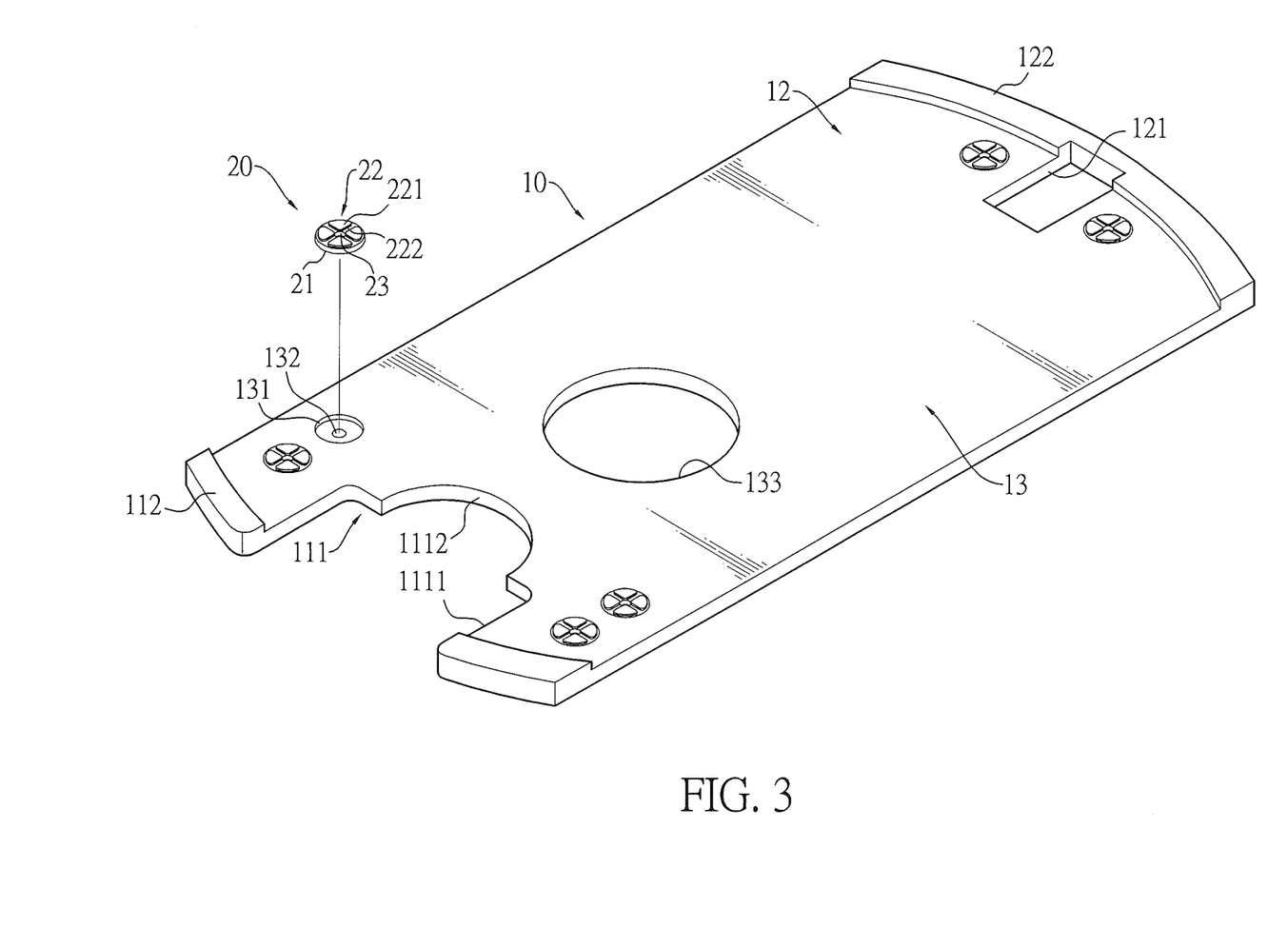
FIG. 3 is an exploded view of the carrier plate assembly in FIG. 1.

With reference to FIGS. 2 and 3, the carrier plate 10 comprises a first end 11, a second end 12, and a carrier surface 13. The first end 11 forms a cavity 111 and two first curved flanges 112. The two first curved flanges 112 are respectively formed on two sides of the cavity 111. The cavity 111 forms a first hollow portion 1111 and a second hollow portion 1112. The second hollow portion 1112 is formed at an edge of the first hollow portion 1111 and concaved toward the second end 12 of the carrier plate 10. The first hollow portion 1111 is a rectangle, but the second hollow portion 1112 is curved. A width of the first hollow portion 1111 is larger than a width of the second hollow portion 1112. The second end 12 forms a through hole 121 and a second curved flange 122. The carrier surface 13 is formed between the first end 11 and the second end 12 and forms a plurality of accommodating recesses 131, a plurality of first holes 132, and a vent 133. Each one of the accommodating recesses 131 is narrowed at an upper end but broadened at a lower end, and each one of the first holes 132 is formed through a bottom surface of a respective one of the accommodating recesses 131. The vent 133 is formed through the carrier surface 13 of the carrier plate 10. The first curved flanges 112 and the second curved flange 122 may have different widths and thicknesses in different embodiments according to different usages or requirements.

Figure 4:
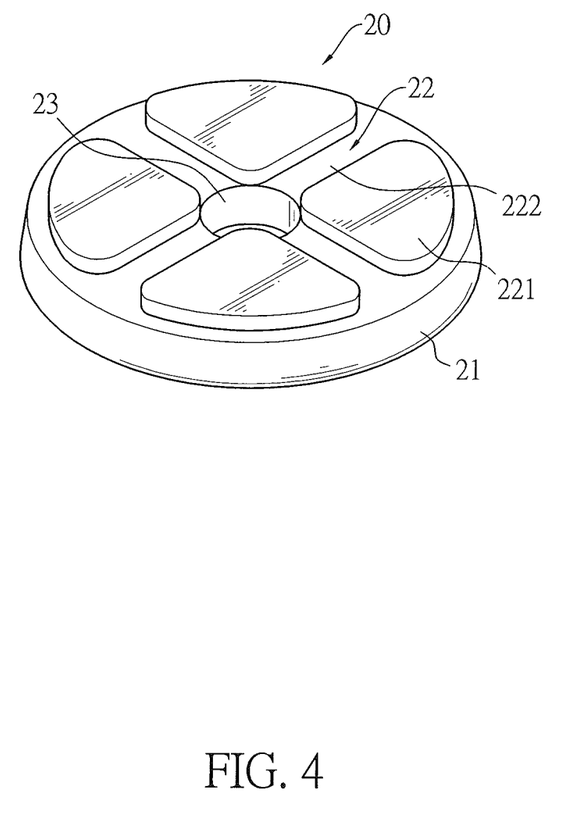
FIG. 4 is a perspective view of a gasket in accordance with the first embodiment of the present invention.
Figure 5:
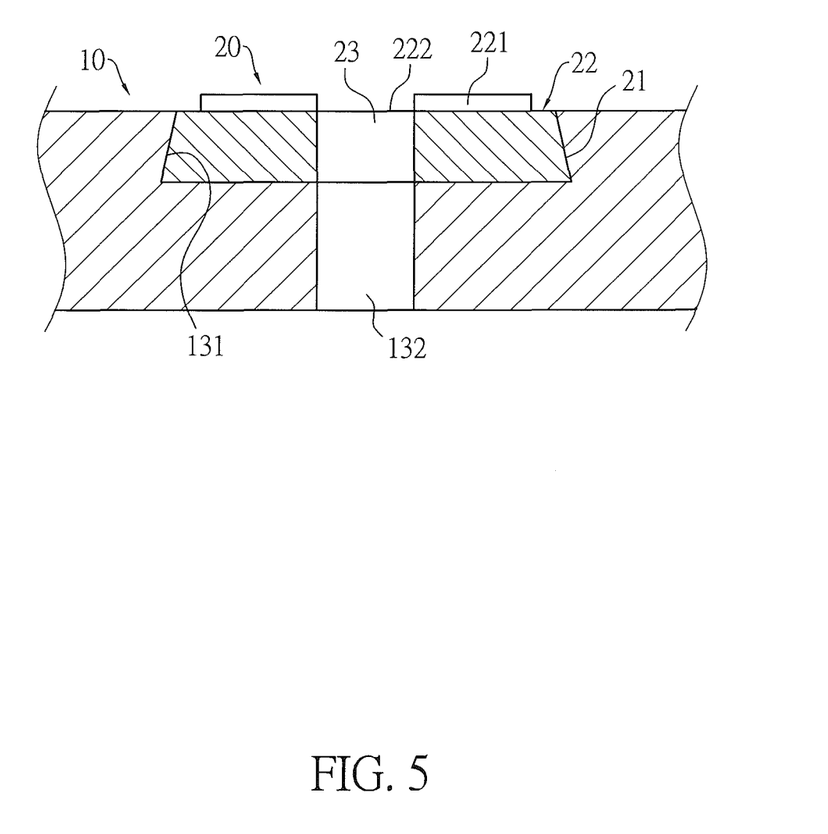
FIG. 5 is a sectional view of a carrier plate assembly in FIG. 1.

Then please also refer to FIGS. 4 and 5. In the first embodiment, each one of the gaskets 20 is accommodated in a respective one of the accommodating recesses 131 and comprises an inclined annular surface 21 and a top surface 22. The inclined annular surface 21 fits a side surface of the corresponding accommodating recess 131. The top surface 22 aligns with the carrier surface 13, and an edge of the top surface 22 of each one of the gaskets 20 is connected to an edge of an opening of the corresponding accommodating recess 131. In other words, the edge of the top surface 22 is a portion of the top surface 22 that is connected with the inclined annular surface 21, and the top surface 22 and the carrier surface 13 form a plane surface together. The top surface 22 of each gasket 20 forms a plurality of protrusions 221 and a plurality of grooves 222. The protrusions 221 protrude out of the carrier surface 13, and each one of the grooves 222 is formed between the protrusions 221. Thus, each protrusion 221 is a sector and the protrusions 221 are arranged annularly and spaced from each other on the top surface 22 of the gasket 20. A bottom surface of each groove 222 is the top surface 22 of the gasket 20 and aligns with the carrier surface 13. Each gasket 20 further forms a second hole 23, and the first hole 132 of each accommodating recess 131 communicates with the second hole 23 of the corresponding gasket 20. The second hole 23 also communicates with the grooves 222. In this embodiment, the second hole 23 is located at a center of the gasket 20, i.e., the second hole 23 is formed at a center of the grooves 222 which are arranged in radial distribution.

Figure 6:
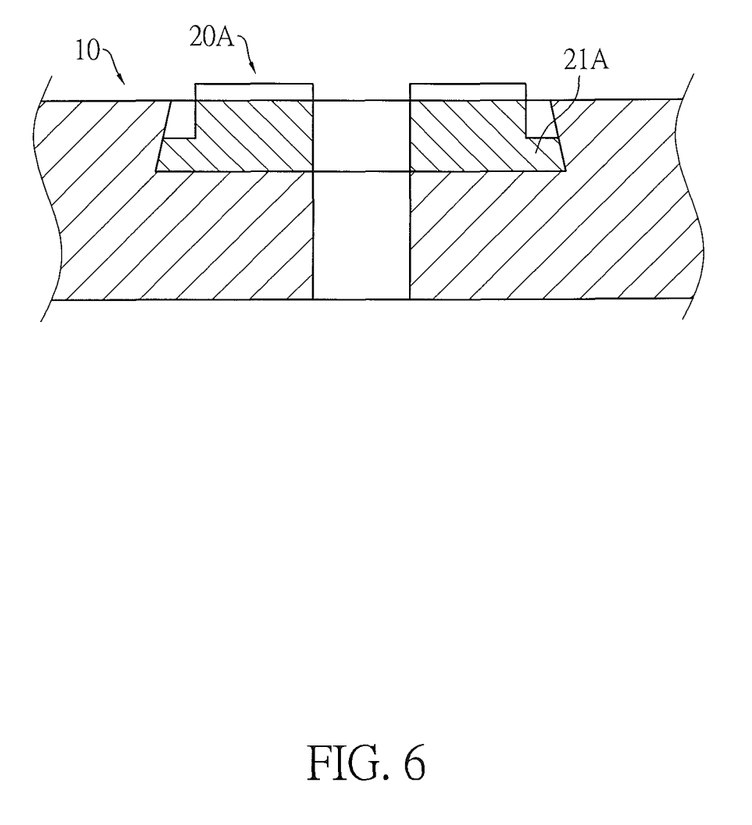
FIG. 6 is a perspective view of a gasket in accordance with the second embodiment of the present invention.

Then please also refer to FIG. 6. In the second embodiment, the top surface of each one of the gaskets 20A is not connected to the carrier surface 13, but may or may not align with the carrier surface 13. Precisely, each gasket 20A forms an annular flange 21A, and the annular flange 21A is formed on a side surface of the gasket 20A and abuts the side surface of the accommodating recess 131, which prevents the gasket 20A from deforming upward.

Please refer to FIG. 1 again. The operating assembly 30 is connected to the second end 12 and comprises a base 31 and at least one telescopic transfer component 32. The at least one telescopic transfer component 32 is mounted on the base 31 and is connected to the carrier plate 10 of one carrier plate assembly. Therefore, the at least one telescopic transfer component 32 can control the movement of the carrier plate assembly for picking up or putting down a wafer. In this embodiment, the operating assembly 30 comprises two telescopic transfer components 32, and the two telescopic transfer components 32 are connected to two carrier plate assemblies respectively.

With the aforesaid structure, the wafer can be put on the carrier surface 13 of the carrier plate 10. An edge of the wafer abuts the first curved flanges 112 and the second curved flange 122 and a bottom surface of the wafer abuts on the gaskets 20. With the vent 133 and the first holes 132 formed on the carrier surface 13 and the second holes 23 formed in the gaskets 20 and communicating the first holes 132, the pressure beneath the bottom surface of the wafer and the pressure on a top surface of the wafer can be balanced. In other words, a vacuum area with lower pressure, which causes the wafer to be discharged from the carrier plate earlier, may not be generated under the bottom surface of the wafer.

Consequently, with the protrusions 221 of the gasket 20 protruding out of the carrier surface 13, when the wafer is held by the mechanical arm of the present invention, the gaskets 20 of the first embodiment provide the wafer with friction and prevent the wafer from sliding. Besides, with the top surfaces 22 of the gaskets 20 aligning with and connected to the carrier surface 13, the accommodating recesses 131 are filled with the gaskets 20 or with the annular flanges 21A of the gaskets 20A, and as the accommodating recesses 131 are narrower at the upper end and broader at the lower end, the gaskets 20, 20A are accommodated in the accommodating recesses 131 securely and may not deform upward. Thus, heights of the gaskets 20, 20A are on the same horizontal plane, so that forces on the wafer are the same.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A carrier plate assembly comprising:
   a carrier plate comprising:
      a first end;
      a second end; and
      a carrier surface between the first end and the second end, and the carrier surface forming:
         a plurality of the accommodating recesses; and
   a plurality of gaskets accommodated in the accommodating recesses respectively, each one of the gaskets comprising:
      an inclined annular surface fitting a side surface of the corresponding accommodating recess; and
      a top surface aligning with the carrier surface, the top surface forming:
         a plurality of protrusions protruding out of the carrier surface; and
         a plurality of grooves located between the protrusions.

2. The carrier plate assembly as claimed in claim 1, wherein an edge of the top surface of each one of the gaskets is connected to an edge of an opening of the corresponding accommodating recess.

3. The carrier plate assembly as claimed in claim 2, wherein the carrier plate further forms:
   a vent through the carrier surface of the carrier plate.

4. The carrier plate assembly as claimed in claim 3, wherein the grooves of each one of the gaskets are formed on the top surface of the gasket in radial distribution.

5. The carrier plate assembly as claimed in claim 4, wherein
   the carrier plate forms:
      a plurality of first holes through bottom surfaces of the accommodating recesses respectively; and
   the gasket forms:
      a second hole communicating with the first hole in the corresponding accommodating recess.

6. The carrier plate assembly as claimed in claim 5, wherein each one of the accommodating recesses of the carrier plate is narrower at an upper end but broader at a lower end.

7. The carrier plate assembly as claimed in claim 6, wherein:
   the first end of the carrier plate forms:
      at least one first curved flange; and
   the second end of the carrier plate forms:
      a second curved flange.

8. The carrier plate assembly as claimed in claim 7, wherein
the first end of the carrier plate forms a cavity; and
the at least one first curved flange includes two first curved flanges on two sides of the cavity respectively.

9. The carrier plate assembly as claimed in claim 8, wherein the cavity of the first end of the carrier plate forms:
a first hollow portion; and
a second hollow portion at an edge of the first hollow portion and concaved toward the second end of the carrier plate.

10. The carrier plate assembly as claimed in claim 9, wherein the second end of the carrier plate forms:
a through hole.

11. The carrier plate assembly as claimed in claim 1, wherein the carrier plate further forms:
a vent through the carrier surface of the carrier plate.

12. The carrier plate assembly as claimed in claim 1, wherein the grooves of each one of the gaskets are formed on the top surface of the gasket in radial distribution.

13. The carrier plate assembly as claimed in claim 1, wherein
the carrier plate forms:
a plurality of first holes through bottom surfaces of the accommodating recesses respectively; and
the gasket forms:
a second hole communicating with the first hole in the corresponding accommodating recess.

14. The carrier plate assembly as claimed in claim 1, wherein each one of the accommodating recesses of the carrier plate is narrower at an upper end but broader at a lower end.

15. The carrier plate assembly as claimed in claim 1, wherein:
the first end of the carrier plate forms:
at least one first curved flange; and
the second end of the carrier plate forms:
a second curved flange.

16. The carrier plate assembly as claimed in claim 15, wherein
the first end of the carrier plate forms a cavity; and
the at least one first curved flange includes two first curved flanges on two sides of the cavity respectively.

17. The carrier plate assembly as claimed in claim 13, wherein the cavity of the first end of the carrier plate forms:
a first hollow portion; and
a second hollow portion at an edge of the first hollow portion and concaved toward the second end of the carrier plate.

18. The carrier plate assembly as claimed in claim 1, wherein the second end of the carrier plate forms:
a through hole.

* * * * *